United States Patent
Lee et al.

(10) Patent No.: US 8,426,739 B2
(45) Date of Patent: Apr. 23, 2013

(54) PRINTED CIRCUIT BOARD AND METHOD FOR MANUFACTURING THE SAME, AND PANEL FOR MANUFACTURING THE PRINTED CIRCUIT BOARD

(75) Inventors: Kwang Tae Lee, Gumi-si (KR); Sung Gue Lee, Gumi-si (KR); Jae Bong Choi, Gumi-si (KR)

(73) Assignee: LG Innotek Co., Ltd., Seoul (KR)

( * ) Notice: Subject to any disclaimer, the term of this patent is extended or adjusted under 35 U.S.C. 154(b) by 176 days.

(21) Appl. No.: 12/745,667

(22) PCT Filed: Dec. 1, 2008

(86) PCT No.: PCT/KR2008/007088
§ 371 (c)(1),
(2), (4) Date: Oct. 5, 2010

(87) PCT Pub. No.: WO2009/069987
PCT Pub. Date: Jun. 4, 2009

(65) Prior Publication Data
US 2011/0036618 A1   Feb. 17, 2011

(30) Foreign Application Priority Data
Nov. 29, 2007 (KR) .......... 10-2007-0123059

(51) Int. Cl.
*H05K 1/03* (2006.01)

(52) U.S. Cl.
USPC ............................ 174/255; 174/254

(58) Field of Classification Search .......... None
See application file for complete search history.

(56) References Cited

U.S. PATENT DOCUMENTS

| | | | | |
|---|---|---|---|---|
| 4,832,621 A | * | 5/1989 | Asai et al. | 439/492 |
| 5,841,194 A | * | 11/1998 | Tsukamoto | 257/729 |
| 6,020,221 A | * | 2/2000 | Lim et al. | 438/125 |
| 6,204,559 B1 | * | 3/2001 | Lin et al. | 257/738 |
| 6,441,314 B2 | * | 8/2002 | Rokugawa et al. | 174/255 |
| 7,115,818 B2 | * | 10/2006 | Kusano et al. | 174/254 |
| 2005/0006138 A1 | * | 1/2005 | Wang et al. | 174/255 |

FOREIGN PATENT DOCUMENTS

| | | |
|---|---|---|
| JP | 56-067982 | 6/1981 |
| JP | 02-148787 A | 6/1990 |
| JP | 11-214806 A | 8/1999 |
| JP | 2000-164997 A | 6/2000 |
| KR | 10-2005-0012080 A | 1/2005 |
| KR | 10-0736633 B1 | 7/2007 |

* cited by examiner

*Primary Examiner* — Ishwarbhai Patel
(74) *Attorney, Agent, or Firm* — Saliwanchik, Lloyd & Eisenschenk

(57) ABSTRACT

Disclosed is a printed circuit board including an insulation member on which a first region and a second region are defined, a circuit pattern formed on the first region, and a support member formed on the second region.

8 Claims, 3 Drawing Sheets

[Fig. 1]
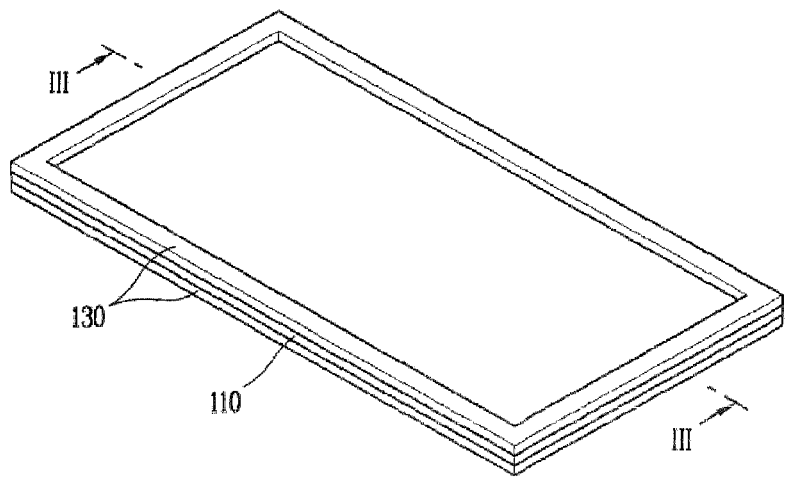
[Fig. 2]
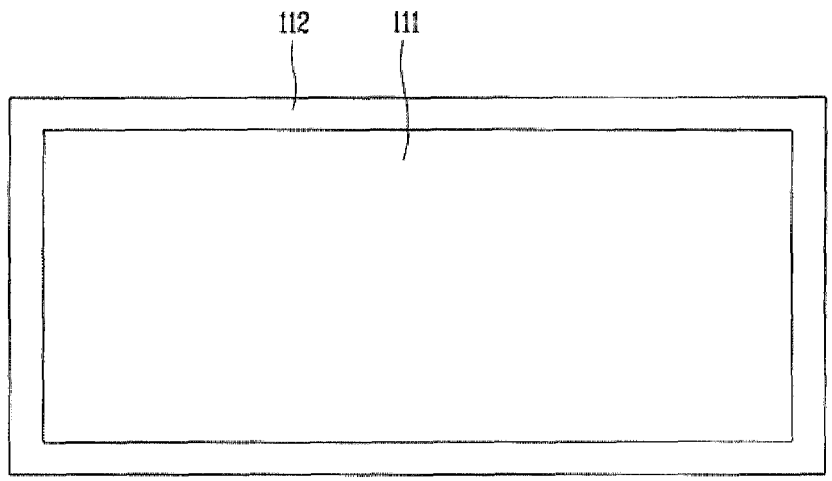
[Fig. 3]
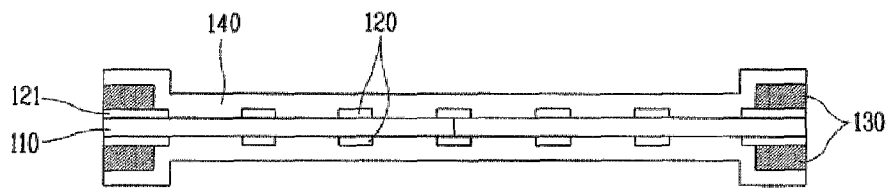
[Fig. 4]
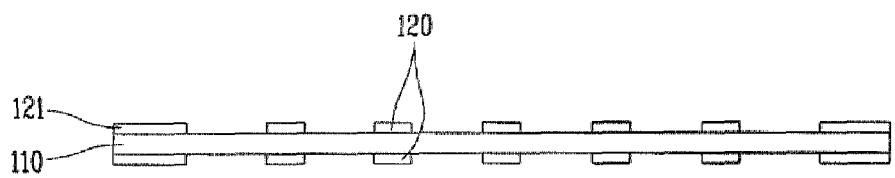

[Figure 3]
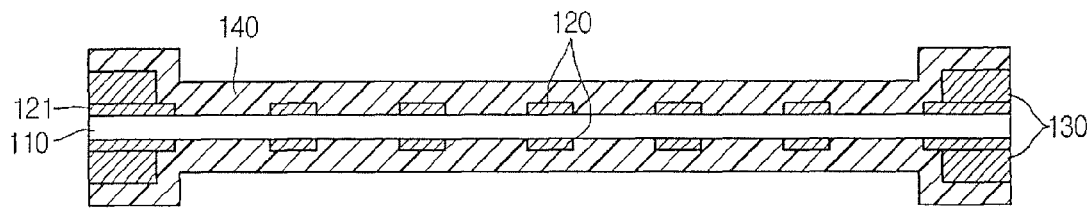
[Figure 4]
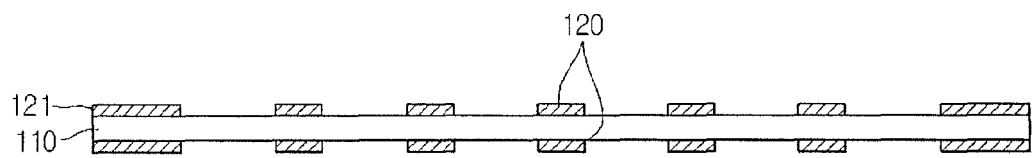
[Figure 5]
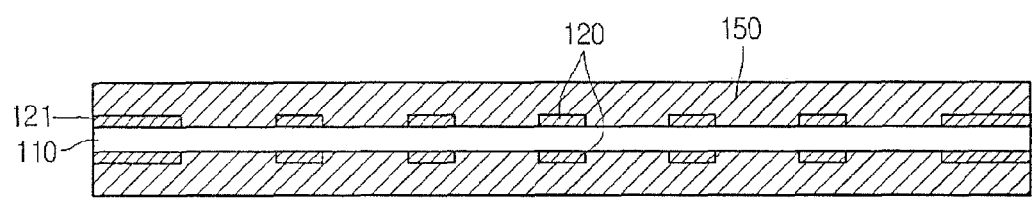
[Figure 6]
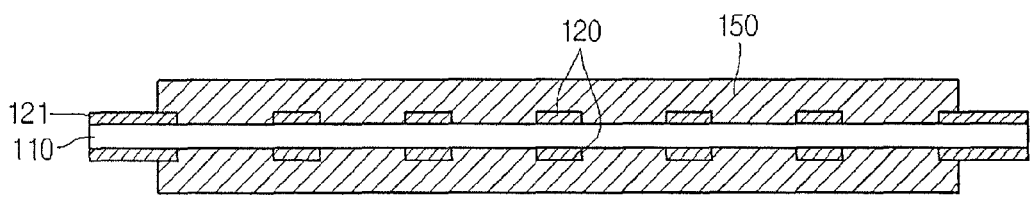
[Figure 7]
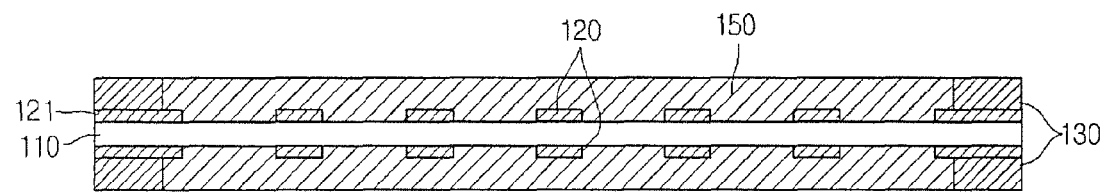

[Figure 8]
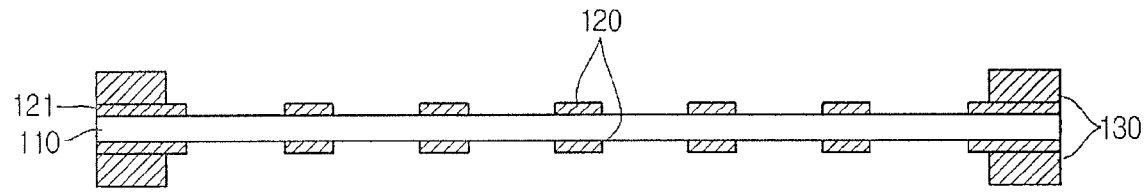
[Figure 9]
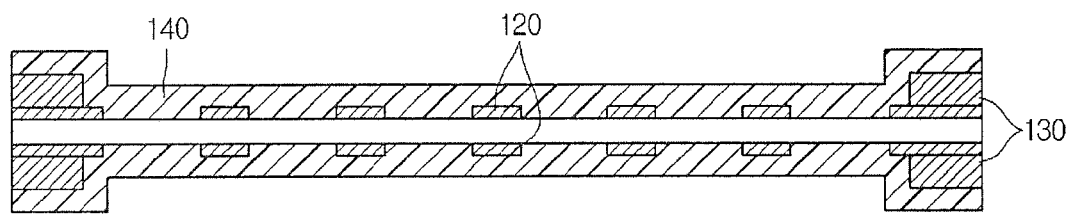
[Figure 10]
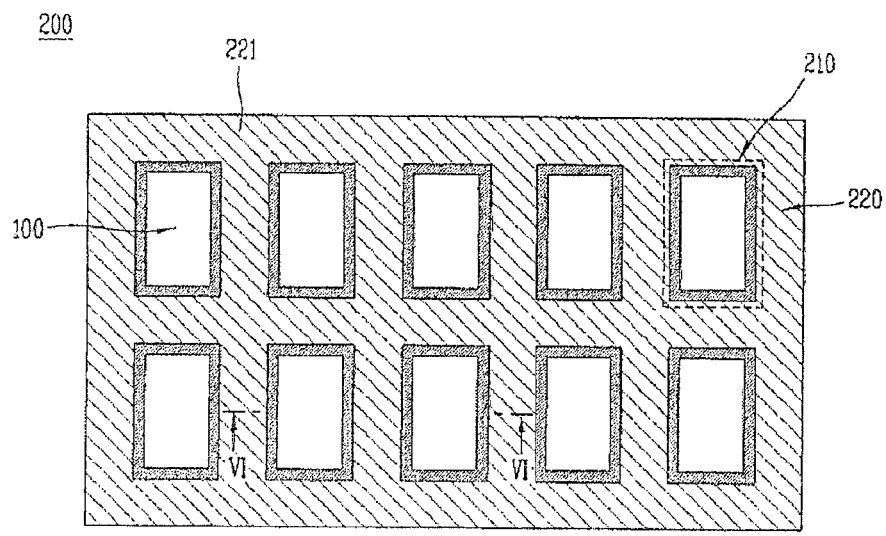
[Figure 11]
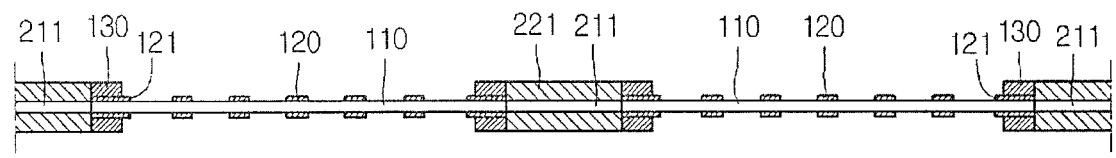

US 8,426,739 B2

PRINTED CIRCUIT BOARD AND METHOD FOR MANUFACTURING THE SAME, AND PANEL FOR MANUFACTURING THE PRINTED CIRCUIT BOARD

CROSS-REFERENCE TO RELATED APPLICATIONS

This application is the U.S. national stage application of International Patent Application No. PCT/KR2008/007088, filed Dec. 1, 2008, which claims priority to Korean Application No. 10-2007-0123059, filed Nov. 29, 2007, the disclosures of each of which are incorporated herein by reference in their entirety.

TECHNICAL FIELD

The present invention relates to a printed circuit board and method for manufacturing the same, and a panel for manufacturing the printed circuit board.

BACKGROUND ART

Various electronic devices are mounted on a printed circuit board such that the electronic devices are electrically connected to each other through a circuit pattern.

Recently, the electronic devices have tended toward mass storage and high integration, so that a thickness of the electronic devices is increased. Accordingly, the printed circuit board must be provided in a slim structure.

In the case that the printed circuit board has a slim structure, the printed circuit board may be broken during the mounting process for the electronic devices, the insulating ink printing process, and the plating process, or the above processes cannot be normally performed.

DISCLOSURE OF INVENTION

Technical Problem

The embodiment provides a printed circuit board having a novel structure, a method for manufacturing the same, and a panel for manufacturing the printed circuit board.

The embodiment provides a printed circuit board, a method for manufacturing the same, and a panel for manufacturing the printed circuit board, in which the printed circuit board is prevented from being deformed during the process for manufacturing the printed circuit board.

The embodiment provides a printed circuit board having superior endurance against external impact, a method for manufacturing the same, and a panel for manufacturing the printed circuit board.

Technical Solution

A printed circuit board according to the embodiment includes an insulation member on which a first region and a second region are defined, a circuit pattern formed on the first region, and a support member formed on the second region.

A panel for manufacturing a printed circuit board according to the embodiment includes a frame including first regions defined on a plurality of portions, respectively, and a second region adjacent to the first regions, a plurality of printed circuit boards formed on the first regions, and a support member formed on the second region.

A method for manufacturing a printed circuit board includes preparing an insulation member, forming a circuit pattern on a first region of the insulation member, and forming a support member on a second region of the insulation member.

Advantageous Effects

The embodiment can provide a printed circuit board having a novel structure, a method for manufacturing the same, and a panel for manufacturing the printed circuit board.

The embodiment can provides a printed circuit board, a method for manufacturing the same, and a panel for manufacturing the printed circuit board, capable of preventing the printed circuit board from being deformed during the process for manufacturing the printed circuit board.

The embodiment can provide a printed circuit board having superior endurance against external impact, a method for manufacturing the same, and a panel for manufacturing the printed circuit board.

BRIEF DESCRIPTION OF THE DRAWINGS

FIG. 1 is a perspective view representing a printed circuit board according to an embodiment;

FIG. 2 is a view representing an insulation member of a printed circuit board divided into a first region and a second region according to an embodiment;

FIG. 3 is a sectional view of a printed circuit board taken along line III-III of FIG. 1;

FIGS. 4 to 9 are views showing a method for manufacturing a printed circuit board according to an embodiment;

FIG. 10 is a plan view representing a panel for manufacturing a printed circuit board according to an embodiment; and FIG. 11 is a sectional view taken line VI-VI of FIG. 10 to illustrate the panel for manufacturing the printed circuit board.

MODE FOR THE INVENTION

Hereinafter, a printed circuit board, a method for manufacturing the same and a panel for manufacturing the printed circuit board according to an embodiment of the present invention will be described in detail with reference to accompanying drawings.

In the description of an embodiment, it will be understood that when a layer (or film), a region, a pattern, or a structure is referred to being "on or "under" another substrate, another layer (or film), another region, another pad, or another pattern, it can be "directly" or "indirectly" on the other substrate, layer (or film), region, pad, or pattern, or one or more intervening layers may be also be present.

The thickness and size of some components shown in the drawings can be exaggerated, omitted or schematically drawn. In addition, the size of each component does not utterly reflect an actual size.

FIG. 1 is a perspective view representing a printed circuit board according to an embodiment, FIG. 2 is a view representing an insulation member of a printed circuit board divided into a first region and a second region according to an embodiment, and FIG. 3 is a sectional view of the printed circuit board taken along line III-III of FIG. 1.

As shown in FIGS. 1 to 3, a printed circuit board 100 according to an embodiment includes an insulation member 110, circuit patterns 120 and a support member 130.

The insulation member 110 serves as a base member for providing endurance to the printed circuit board 100.

The circuit pattern 120 is formed on an upper surface and/or a lower surface of the insulation member 110. The circuit patterns 120 are electrically connected to each other through a conductive via formed through the insulation member 110. In addition, the insulation member 110 has a single layer structure or a multi layer structure.

For example, the insulation member 110 includes phenol resin or epoxy resin including glass fibers.

According to the embodiment, the insulation member 110 has a thickness of 60 mm or below to minimize the bad influence caused by the high thickness of electronic devices provided on the printed circuit board 100.

The insulation member 110 includes a first region 111 formed at an upper surface and/or a lower surface thereof and a second region 112 formed on the edge of the first region 111.

For example, if the insulation member 110 has a rectangular shape, the second region 112 is defined along the edges of the insulation member 110, and the first region 111 is defined on the internal side of the second region 112.

Although the second region 112 shown in FIG. 2 is defined on four edges of the first region 111, the present invention is not limited thereto. The second region 112 according to another embodiment can be defined on a part of the four edges.

In addition, although the second region 112 shown in FIG. 2 has a rectangular shape, the present invention is not limited thereto. The second region 112 according to another embodiment can be provided in various shapes.

The circuit pattern 120 is formed on the first region 111, and the circuit pattern 120 includes conductive material, for example, copper. The circuit pattern 120 can be provided in various shapes according to the design of the printed circuit board 100.

The support member 130 for supporting the insulation member 110 is formed on the second region 112 to maintain the insulation member 110 in a planar shape while preventing the insulation member 110 from being twisted or deformed.

For example, the support member 130 is provided in a band shape having a predetermined width while surrounding the first region 111 of the insulation member 110.

The support member 130 includes metallic material, for example, copper, and the support member 130 includes the same material as the circuit pattern 120.

Meanwhile, a conductive pattern 121 is formed on the second region 112, and the support member 130 is formed on the conductive pattern 121.

If the support member 130 is formed through an electroplating, the conductive pattern 121 serves as a passage for electrical current used for the electroplating process. In addition, due to the conductive pattern 121, the thickness of the support member 130 can be reduced by the thickness of the conductive pattern 121 when the support member 130 is formed.

Although the support member 130 shown in FIG. 3 is formed at an upper surface of the conductive pattern 121, the present invention is not limited thereto. According to another embodiment, the printed circuit board 100 does not include the conductive pattern 121, and the support member 130 can be directly formed on the insulation member 110.

In addition, the printed circuit board 100 according to the embodiment further includes a protection layer 140 for covering the insulation member 110, the circuit pattern 120 and the support member 130.

The protection layer 140 minimizes the physical and/or chemical influence exerted on the insulation member 130, the circuit pattern 120 and the support member 130 by external factors. For example, the protection layer 140 includes permanent compounds, such as solder mask ink.

Meanwhile, although the conductive pattern 121, the circuit pattern 120, the support member 130 and the protection layer 140 according to the embodiment are formed on the upper surface and the lower surface of the insulation member 110, the present invention is not limited thereto. According to another embodiment, the conductive pattern 121, the circuit pattern 120, the support member 130 and the protection layer 140 can be formed on the upper surface or the lower surface of the insulation member 110.

According to the printed circuit board 100 of the present invention, the support member 130 is formed on the second region 112 of the insulation member 110, so that the printed circuit board 100 is prevented from being deformed, and the planar shape of the printed circuit board 100 can be maintained.

Accordingly, even if the printed circuit board 100 has a very small thickness, the printed circuit board 100 is prevented from being deformed in a direction vertical to a main plane of the printed circuit board 100.

As a result, in the process for manufacturing the printed circuit board 100, the printed circuit board 100 transported through a conveyer belt is prevented from being drawn inside the conveyer belt due to deformation of the printed circuit board. In addition, the printed circuit board 100 is prevented from being torn away by plating fluids during the plating process, and the printed circuit board 100 is prevented from sticking to a screen when the printing process is performed using insulation ink.

FIGS. 4 to 9 are views showing a method for manufacturing a printed circuit board according to an embodiment.

As shown in FIG. 4, the circuit pattern 120 is formed on the first region 111 of the insulation member 110. The circuit pattern 120 can be formed through various schemes including the electroplating process and an etching process using a photoresist film.

In the process for manufacturing the circuit pattern 120, the conductive pattern 121 can be formed together with the circuit pattern 120 on the second region 112 of the insulation member 110. In addition, the conductive pattern 121 is formed using the same material and the same process as those of the circuit pattern 120.

As shown in FIGS. 5 and 6, a mask layer 150 is formed on the insulation member 110 including the conductive pattern 121 and the circuit pattern 120, and then the mask layer 150 is removed such that a part of the conductive pattern 121 is exposed.

For example, the mask layer 150 is formed using a photoresist film, and the photoresist film may include a positive photoresist film or a negative photoresist film.

As shown in FIG. 7, the support member 130 is formed on the conductive pattern 121. The support member 130 includes metallic material such as copper and is formed through the electroplating by applying electrical current to the conductive pattern 121.

The support member 130 has a thickness larger than that of the circuit pattern 120.

According to another embodiment, the support member 130 can be formed through a printing process or a curing process, while omitting a process for forming the conductive patter 121 on the second region 112.

As shown in FIGS. 8 and 9, the mask layer 150 is removed, and then the protection layer 140 is formed on and the support member 130, the conductive pattern 121, the circuit pattern 120 and the insulation member 110.

For example, the protection layer 140 is formed by coating solder mask ink.

As a result, the printed circuit board 100 shown in FIGS. 1 to 3 is fabricated.

FIGS. 10 and 11 are views showing a panel for manufacturing a printed circuit board according to the embodiment. FIG. 10 is a plan view representing the panel for manufacturing the printed circuit board according to the embodiment, and FIG. 11 is a sectional view taken line VI-VI of FIG. 10 to illustrate the panel for manufacturing the printed circuit board.

The panel 200 for manufacturing the printed circuit board according to the embodiment is used to align a plurality of printed circuit boards 100 thereon such that the printed circuit boards 100 can be simultaneously manufactured. The panel 200 for manufacturing the printed circuit board includes a frame 211, the printed circuit board 100 and a support member 221.

The frame 211 includes first regions 210 formed on a plurality of portions of the frame 211, respectively, and a second region 220 formed on the remaining portion of the frame 211 except for the first regions 210.

The frame 211 includes the same material as the insulation member 110 of the printed circuit board 100. In addition, the frame 211 and the insulation member 100 can be formed as a separate unit, or integrally formed with each other. Further, the frame 211 has the same thickness as that of the insulation member 110.

The printed circuit boards 100 are provided on the first regions 210, respectively. Since details of the printed circuit board have been described above, the details will not be repeatedly described. However, according to another embodiment, the printed circuit board 100 mounted on the frame 211 may have a structure in which the conductive pattern 121 and/or the support member 130 is removed from the printed circuit board 100.

The support member 221 for supporting the frame 211 is provided on the second region 220 of the frame 211 to maintain a planar shape of the frame 211, and includes metallic material such as copper. The support member 221 can be formed through the same process as the support member 130 which is described above in the method for manufacturing the printed circuit board 100.

After a process of mounting the electronic devices on the printed circuit board 100 is completed, the printed circuit board 100 disposed on the panel 200 for manufacturing the printed circuit board is separated from the panel 200, thereby completing the process for manufacturing the printed circuit board 100.

As described above, in the panel 200 for manufacturing the printed circuit board, the support member 221 is provided on the second region 220, other than the first region 210 on which the printed circuit board 100 is arranged. Thus, even if the frame 211 has a very small thickness, the deformation occurring in the frame 211 is minimized, thereby improving the reliability of the process of manufacturing the printed circuit board 100.

Stages of the process for manufacturing the printed circuit board do not need to be performed according to the sequence described above according to design specification, and each stage can be selectively performed in combination with other stages. Accordingly, the configuration of the printed circuit board and the panel for manufacturing the printed circuit board, which can be manufactured in combination with the stages described above, may include various modifications within the scope of the present invention.

Although few embodiments of the present invention have been shown and described, the above embodiment is illustrative purpose only, and it would be appreciated by those skilled in the art that changes and modifications, which have not been illustrated above, may be made in these embodiments without departing from the principles and scope of the invention, the scope of which is defined in the claims and their equivalents.

INDUSTRIAL APPLICABILITY

The embodiment can be applied to a printed circuit board and a method for manufacturing the same.

The invention claimed is:

1. A printed circuit board comprising:
an insulation member on which a first region and a second region are defined;
a circuit pattern formed on the first region;
a support member formed on the second region; and
a conductive pattern disposed between the support member and the insulation member,
wherein a width of the conductive pattern is greater than a width of the support member,
wherein an upper surface of the conductive pattern is partially contacted with an entire lower surface of the support member.

2. The printed circuit board as claimed in claim 1, wherein the second region is disposed on an edge of the first region.

3. The printed circuit board as claimed in claim 1, wherein the second region surrounds the first region.

4. The printed circuit board as claim in claim 1, wherein the support member includes metallic material.

5. The printed circuit board as claimed in claim 1, wherein the support member includes a material identical to a material of the circuit pattern.

6. The printed circuit board as claimed in claim 1, wherein the support member has a thickness larger than a thickness of the circuit pattern.

7. The printed circuit board as claimed in claim 1, further comprising a protection layer for covering the insulation member, the circuit pattern and the support member.

8. The printed circuit board as claimed in claim 1, wherein the support member is formed on at least one surface of the insulation member.

* * * * *